United States Patent [19]

Stacy et al.

[11] Patent Number: 4,569,120

[45] Date of Patent: Feb. 11, 1986

[54] METHOD OF FABRICATING A PROGRAMMABLE READ-ONLY MEMORY CELL INCORPORATING AN ANTIFUSE UTILIZING ION IMPLANTATION

[75] Inventors: William T. Stacy, San Jose; Sheldon C. P. Lim; Kevin G. Jew, both of Sunnyvale, all of Calif.

[73] Assignee: Signetics Corporation, Sunnyvale, Calif.

[21] Appl. No.: 472,803

[22] Filed: Mar. 7, 1983

[51] Int. Cl.[4] .................. H01L 21/265; H01L 21/479
[52] U.S. Cl. ......................................... 29/574; 29/575; 29/576 B; 29/576 C; 29/576 E; 29/578; 29/584; 29/586; 148/1.5; 148/174; 148/187; 148/DIG. 55; 357/2; 357/45; 357/51; 357/59; 357/91; 365/94; 365/103; 365/105
[58] Field of Search .............. 148/1.5, 174, 187; 29/574, 575, 576 B, 576 E, 576 C, 577 C, 578, 584, 586; 357/45, 51, 59, 2, 91; 365/94, 103–105

[56] References Cited

U.S. PATENT DOCUMENTS

| | | |
|---|---|---|
| 3,736,192 | 5/1973 | Tokuyama et al. . |
| 3,990,098 | 11/1976 | Mastrangelo ........................... 357/2 |
| 4,069,068 | 1/1978 | Beyer et al. . |
| 4,146,902 | 3/1979 | Tanimoto et al. ................. 357/51 X |
| 4,203,123 | 5/1980 | Shanks . |
| 4,217,374 | 8/1980 | Ovshinsky et al. .................... 427/39 |
| 4,226,898 | 10/1980 | Ovshinsky et al. .................... 427/39 |
| 4,238,694 | 12/1980 | Kimerling et al. . |
| 4,403,399 | 9/1983 | Taylor ..................................... 29/574 |
| 4,420,766 | 12/1983 | Kasten ................................ 357/51 X |
| 4,432,008 | 2/1984 | Maltiel ................................. 357/51 |
| 4,442,507 | 4/1984 | Roesner ............................. 365/100 |

FOREIGN PATENT DOCUMENTS 2066566A 12/1980 United Kingdom .
2086654A 5/1982 United Kingdom .

OTHER PUBLICATIONS

IBM Technical Disclosure Bulletin, vol. 18, No. 4, Sep. 1975, p. 1211.
Tanimoto et al., "Novel 14 V Programmable . . . Poly-Si Resistor . . . ", IEEE J. Solid-State Circ., vol. SC-17, No. 1, Feb. 1982, pp. 62–68.

Primary Examiner—William G. Saba
Attorney, Agent, or Firm—J. A. Dinardo; R. Meetin; R. Mayer

[57] ABSTRACT

In fabricating a PROM cell, an electrical isolation mechanism (44 and 32) is formed in a semiconductive body to separate islands of an upper zone (36) of first type conductivity (N) in the body. A semiconductor is introduced into one of the islands to produce a region (48) of opposite type conductivity (P) that forms a PN junction with adjacent semiconductive material of the island. Ions are implanted to convert a surface layer (60) of the region into a highly resistive amorphous form which is irreversibly switchable to a low resistance state. A path of first type conductivity extending from the PN junction through another of the islands to its upper surface is created in the body to complete the basic cell.

19 Claims, 15 Drawing Figures

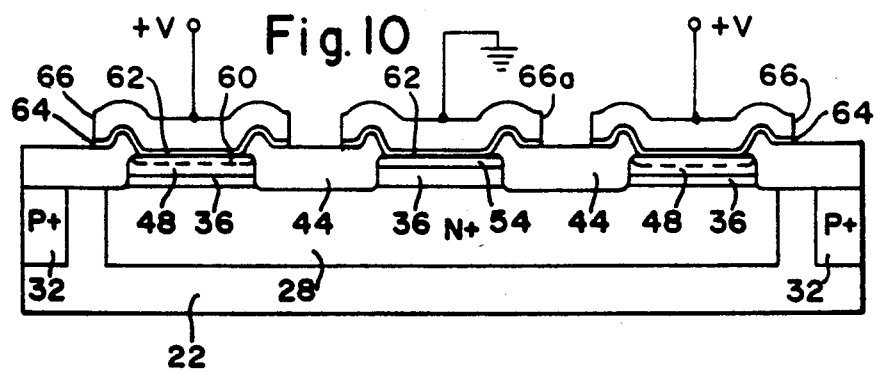
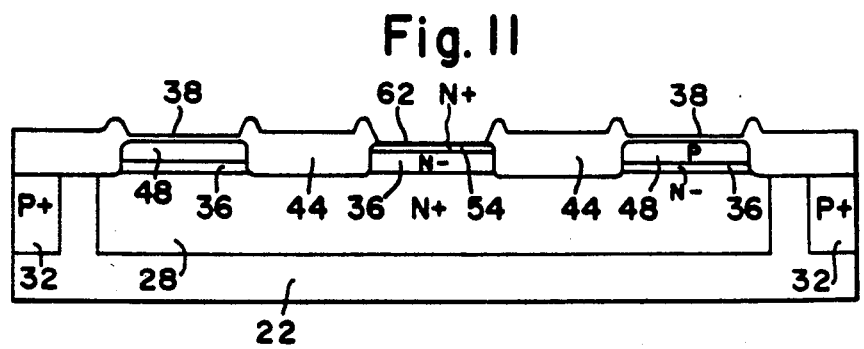
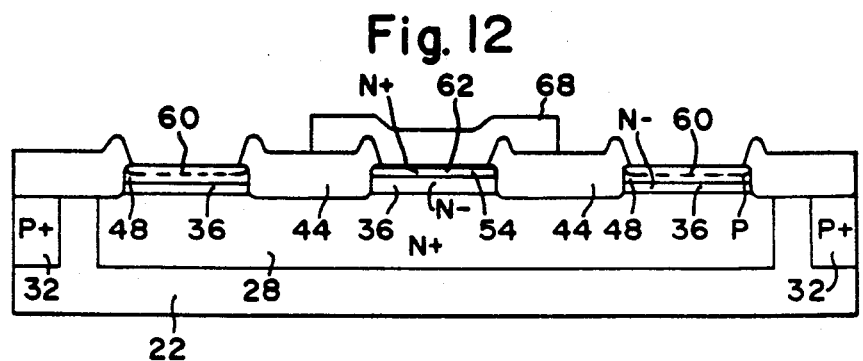
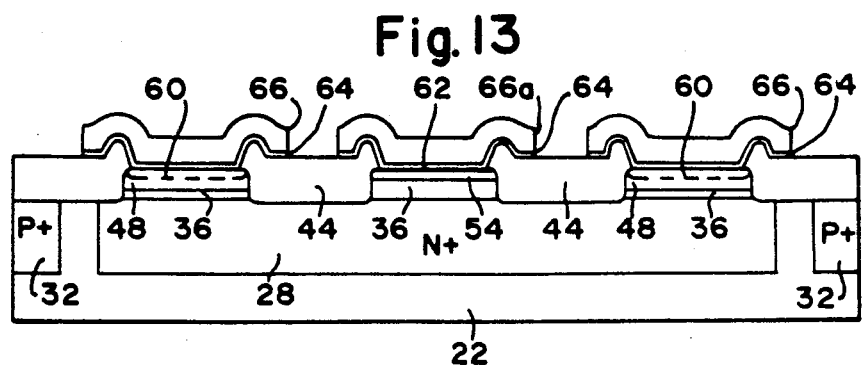

4,569,120

METHOD OF FABRICATING A PROGRAMMABLE READ-ONLY MEMORY CELL INCORPORATING AN ANTIFUSE UTILIZING ION IMPLANTATION

BACKGROUND OF THE INVENTION

This invention relates to semiconductor memories and in particular to programable read-only memories.

Most programmable read-only memories (PROMS) currently being manufactured utilize metallic fusible links, or fuses, as the programming element in the memory array. These fuses laterally connect an array element, such as a diode, with a bit line. All of these components and/or their connections occupy space on the semiconductor chip area, such as the metal bit line, the laterally extending metal fuse, and the metal contact pad to the diode, for example. Since the memory array may contain thousands of array cells constituted by these components, such as 16,384 cells for a 16K PROM, the memory array occupies a major portion of the integrated circuit chip area for a high density state of the art PROM. Any space savings that can be achieved in the individual memory cells of the array will significantly reduce the size of the integrated chip and thereby increase the yield, that is, the number of good chips producible from a given wafer. As the yield increases, the unit manufacturing cost goes down.

One means of reducing the cell area would be to replace the lateral metal fuse with one that does not occupy any additional space than is required for the metal bit line and the contact to the diode. This could be done with a programmable element located directly over the diode. Some researchers have proposed vertical antifuses in the form of destructible diodes of reverse electrical orientation from the array diode. One such device of this type is disclosed in U.S. Pat. No. 3,641,516 to Castrucci et al. Programming of this type of antifuse is accomplished by subjecting the destructible diode to high reverse current flow and causing aluminum migration from the contact and bit line to short circuit the destructible diode.

It should be mentioned here that an antifuse is the opposite of a fuse link. An unprogrammed antifuse is non-conducting, and it is programmed by changing it to a conductive or low resistance state so as to close a circuit between the bit line and the array diode. A fuse link, on the other hand, is conductive when unprogrammed, and it is programmed by changing it to a non-conducting state so as to open or break the circuit between the bit line and the array diode.

Other proposals for an antifuse in memories have involved the use of deposited films of chalcogenide elements or amorphous silicon which become conducting when subjected to an electrical bias voltage. UK patent application No. GB 2086654A discloses deposited films of amorphous silicon and UK patent application No. GB 2065972A discloses deposited films of chalcogenide elements.

SUMMARY OF THE INVENTION

According to the invention a vertical antifuse is produced by implanting ions into selected regions of monocrystalline semiconductive material. The implanted ions convert the crystalline sites to amorphous regions which are normally non-conductive or highly resistive, but which can be converted irreversibly to a conductive or low resistance state. The vertical antifuse region is formed in a part of one region of a semiconductor body that serves as one electrode of the array diode, with the other electrode of the array diode being constituted by another region of the semiconductor body that is adjacent to the one region, all three regions being vertically arranged within the semiconductor body.

BRIEF DESCRIPTION OF THE DRAWING

FIGS. 2 through 13 are cross sectional views showing the various process steps for fabricating an integrated circuit memory array incorporating an amorphous silicon antifuse structure according to the invention.

DETAILED DESCRIPTION OF THE PREFERRED EMBODIMENT

Figure 1:
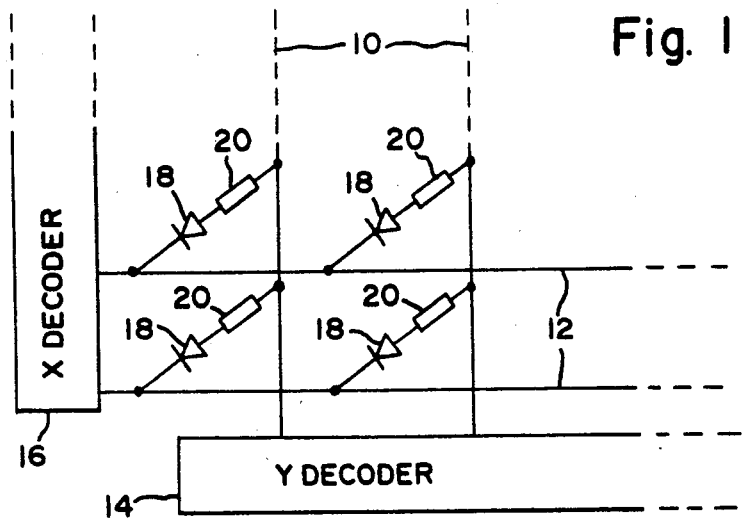
FIG. 1 is an electrical schematic diagram of a portion of a bipolar memory array.
Figure 2:
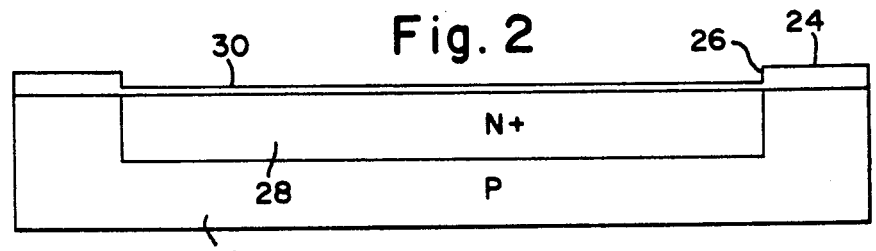
Figure 3:
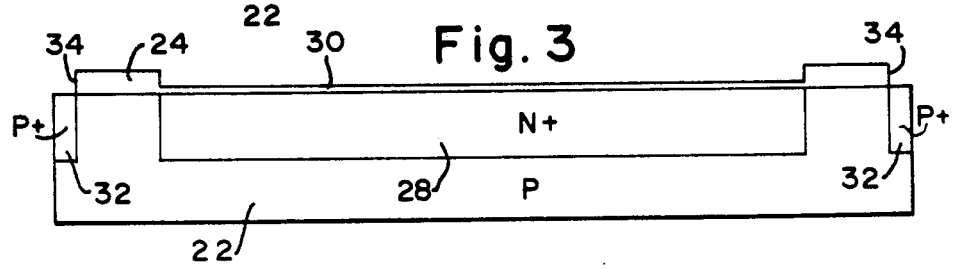

In the schematic diagram of FIG. 1 there is shown a junction diode memory array in which a plurality of bit lines 10 are arranged in columns and a plurality of word lines 12 are arranged in rows. The bit lines 10 are coupled to a Y decoder 14 and the word lines 12 are coupled to an X decoder 16 for making the column and row selection in the usual manner.

At each cross-over of a bit line 10 and word line 12 there is a junction diode 18 and an antifuse 20. When an electrical potential difference is applied between a bit line 10 and a word line 12 so as to forward bias the junction diode 18 connected therebetween, an electrical sensing current will flow between the two selected lines 10 and 12 provided the antifuse 20 is in the conducting state.

To program a given element, a high potential difference can be applied which will supply sufficient voltage bias across the antifuse 20 to change it from a normally high resistance state to a low resistance or conducting state, thereby completing the series circuit between a pair of lines 10 and 12. Then when a lower sensing voltage is applied between the two lines 10 and 12, a sensing current will flow. In the absence of a programming voltage bias applied between selected lines 10 and 12, the antifuse 20 is highly resistive or non-conducting and no sensing current can flow. The presence of sensing current can indicate one state such as a zero (0) and the absence of sensing current can indicate the other state such as a one (1).

Reference is now made to FIGS. 2 through 10 which show the sequence of steps for fabricating a memory array according to the invention. The fabrication process shown in FIG. 2 starts with furnishing a P type substrate 22 of semiconductor material, such as silicon, which is lightly doped to have about 7 to 21 ohm-centimeters of resistivity and has a crystal axis orientation of 111. On the surface of the silicon substrate 22 a thick oxide layer 24 is grown to a thickness of one micrometer or more depending upon the doping source to be used in forming the buried layer to be described.

Openings 26 are formed in the oxide layer 24 by photolithographic processing means, such as photomasking and etching, to delineate the regions where N type diffusions are next made for the N+ buried layers 28. While only one opening 26 is shown, it is understood that the same openings 26 and diffusions can be repeated as many times as necessary over the area of the substrate to produce the desired number of elements of the array. Also, similar other openings and diffusions can be made simultaneously to provide the buried collector regions for peripheral transistors that are located outside the area boundaries of the memory array.

A heavy dosage of N type dopant, such as arsenic or antimony, is introduced by diffusion or ion implantation to form the N+ regions 28. A protective oxide layer 30 of about 0.25 micrometer is grown on the N+ region 28 during the subsequent annealing which drives the N+ region 28 to a depth of about 2.5 micrometers and results in a sheet resistance for the N+ region 28 of 30 ohms per square, as dictated by the requirements of the peripheral transistors rather than the antifuse structure.

Another masking and etching procedure is carried out to delineate and produce the P+ regions 32 surrounding the N+ regions 28. These P+ regions 32 are formed by introducing a P type dopant, such as boron, by diffusion or ion implantation through openings 34 in the mask comprising oxide layers 24 and 30. The P+ regions 32 aid in isolating the memory cell areas from each other and from the other components on the same chip. During the subsequent annealing process a thin oxide layer, not shown, grows over the P+ regions 32.

Figure 4:
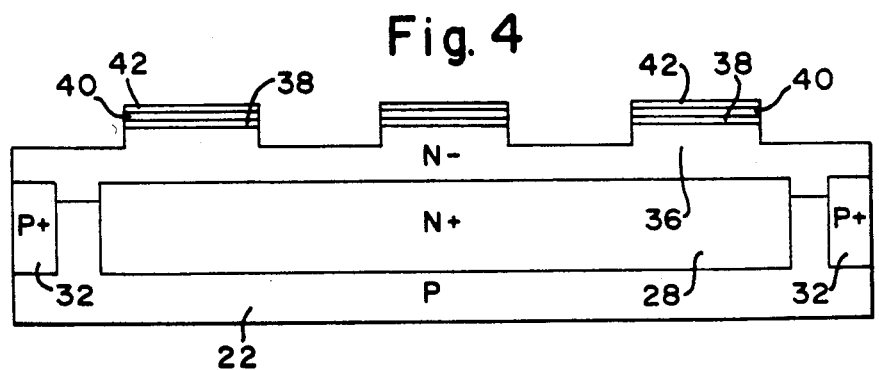
Figure 5:
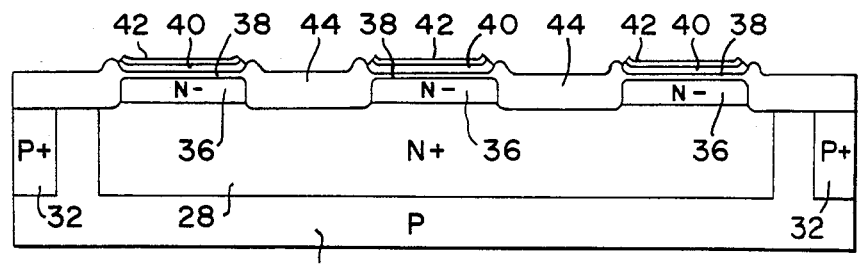

After the P+ regions 32 are formed, all the oxide in layers 26 and 30 and over the P+ regions 32 is stripped away to the bare silicon, and a lightly doped epitaxial layer 36 of N type silicon is grown on the silicon substrate 22 including the N+ buried regions 28 and P+ buried regions 32. The thickness of the epitaxial layer 36 is about 1.9 micrometers and the resistivity is about 0.7 ohm centimeters. The epitaxial layer 36 is shown in FIG. 4. During growth of the epitaxial layer 36, the P+ regions 32 and the N+ buried regions 28 diffuse in all directions and grow in size, as shown.

Following the formation of the epitaxial layer 36, a silicon dioxide layer 38 of about 280 angstroms is grown on the entire surface of the epitaxial layer 36, followed by deposition on the oxide layer 38 of a layer 40 of silicon nitride of about 0.13 micrometer in thickness. The silicon nitride layer 40 is then oxidized to produce a layer 42 of silicon dioxide thereon about 200 angstroms thick. The three layer sandwich including bottom oxide layer 38, silicon nitride layer 40 and top oxide layer 42 is masked and etched, layer by layer, down to the surface of the epitaxial layer 36 to produce spaced apart layer portions of the sandwiched structure. In FIG. 4, three layer portions are shown overlying the buried N+ region 28. The surface of the epitaxial layer 36 is bare on either side of the layer portions. The oxide layers 38 and 42 may be etched with a hydrofluoric acid solution and the silicon nitride layer 40 may be etched with 150° C. phosphoric acid.

Following the etching of the three layer sandwich including layers 38, 40, 42, the epitaxial layer 36 not masked by the three layer sandwich is etched, as by hydrofluoric, nitric and acetic acids with iodine solutions, down to a depth of about 0.65 micrometer. The etched surface of the epitaxial layer 36 is then thermally oxidized to a thickness of about 1.3 micrometers. Since the oxide grows both outwardly from the silicon surface as well as inwardly into the silicon the surface of the locally oxidized regions, shown at 44 in FIG. 5, will thicken beyond the original surface level of the etched epitaxial layer 36 and merge with the bottom silicon dioxide layer 38 of the three layer sandwich. The bottom of the oxide regions 44 reach the P+ regions 32 and the N+ buried layer 28. The oxide regions 44, together with the P+ regions 32 serve to provide the necessary isolation between elements of the memory structure.

Figure 6:
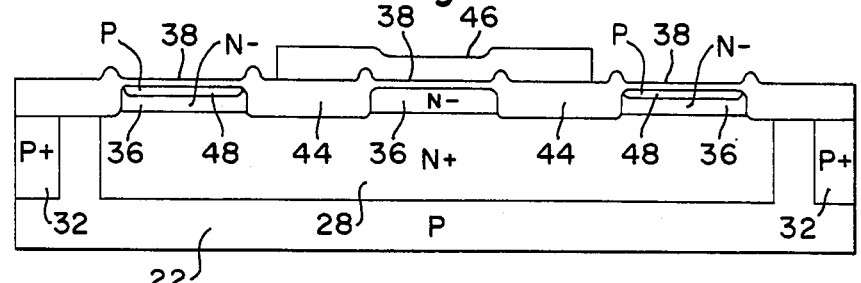

After the oxide isolation regions 44 are formed, the top oxide layer 42 and the silicon nitride layer 40 are etched away and a photoresist layer 46 is deposited over the epitaxial layer 36. The photoresist layer 46 is then masked and etched to remove it from those areas where it is desired to introduce dopant ions into the epitaxial layer 36 to produce the junction diodes for the memory array. Because of the presence of the oxide isolation regions 44 which themselves act to mask the dopant ions and provide self alignment, the masking can be oversize and lacking in precision. The photoresist is removed only over the lateral end portions of the N+ layer 28, and it remains over the central part of the buried layer 28. The thin oxide layer 38 is permitted to remain over the semiconductor regions 36 to provide screening for the implanted ions. If the dopant impurities are introduced by diffusion, the thin oxide layer 38 is removed prior to diffusion. The implanted or diffused ions are P type, such as boron, and following annealing, the P type regions 48 are produced, as shown in FIG. 6. The P type regions 48 are moderately doped, are spaced from the N+ layer 28, and form a semiconductor junction with the N doped epitaxial layer 36. The same implant or diffusion of the P dopants into other regions serves as the bases of the peripheral transistors.

Figure 7:
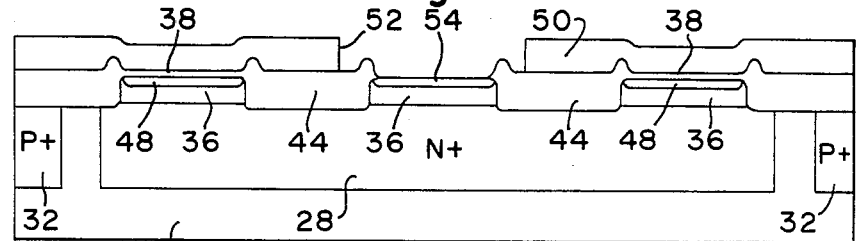

The next step is shown in FIG. 7 and comprises covering the wafer with a photoresist layer 50. The photoresist layer 50 is then masked and etched to provide an opening 52 over the central portion of the N+ buried layer 28 to define a region where an N+ contact region 54 is to be formed in the epitaxial layer 36. The N+ contact region 54 is produced by diffusion, or implantation followed by annealing. A heavy dosage of N type impurity such as arsenic may be used. An oversized opening 52 can be used because of the self alignment action of the surrounding isolation regions 44. The N+ contact region 54 serves as a common conductive connection to the two PN junction diodes formed by the P+ regions 48 and the N type epitaxial layer 36, with a low resistance path to each diode being provided through the N+ buried layer 28. The same implant or diffusion of these N type dopants into other regions of the chip serves as the emitters of the peripheral transistors.

Figure 8:
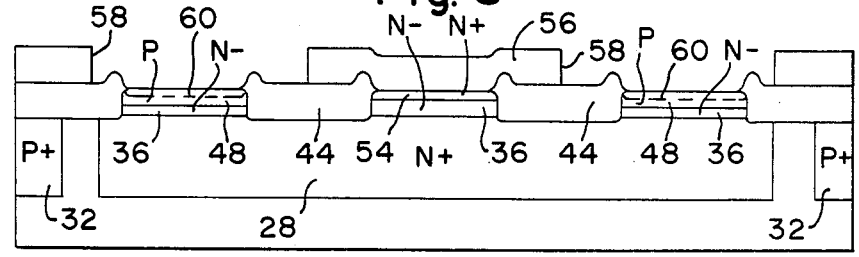
Figure 9:
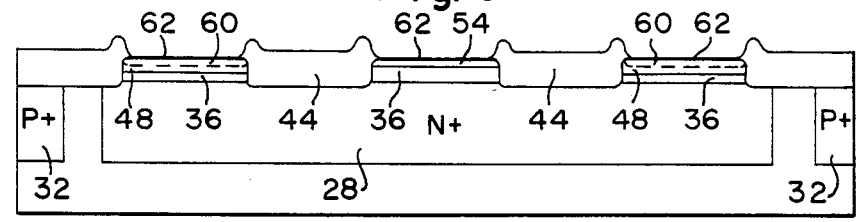

After the N+ contact region 54 is formed, the subsequent series of processing steps can take more than one course. In the embodiments described, at least two alternative processing sequences are described. The first processing sequence is illustrated in FIGS. 8 through 10, which show the processing steps following annealing which drives the P regions 48 and N+ contact region 54 deeper into the epitaxial layer 36. Following annealing, the thin oxide layer 38 over the P regions 48 is removed, another photoresist layer 56 is provided to mask the N+ contact region 54, and oversized openings 58 are made over the P type regions 48, as shown in FIG. 8. The openings 58 define the regions where ions are to be implanted into the P type regions 48 formed in the epitaxial layer 36. The ions act to convert the monocrystalline silicon to amorphous silicon. The implant regions are shown at 60.

It is necessary for conversion of the crystalline silicon to amorphous form that the implanted ions have a suitable combination of dose and energy. Also, in order to provide a proper antifuse that can change its state from high resistance to low resistance upon application of a suitable electrical bias voltage, the choice of the implant species depends upon the type of array diode used. In the case of a PN junction diode as already described, where the implant is made into the P type regions 48, a P type or neutral dopant is required to produce a proper antifusing element. If an N type dopant, such as arsenic, is used with the P type regions 48, the resulting combination of N type and P type regions is initially non-conducting and changes to an NP diode on application of an electrical switching voltage. On the other hand, when arsenic is implanted into an N type region, the resulting non-conducting element can be converted to a conducting state or low resistance upon application of suitable electrical switching voltage. It is expected that other N type dopants, such as phosphorus and antimony will exhibit similar behavior.

It has been found that argon ions of the proper dose and energy are suitable for implantation into the P type regions 48. With implant energies ranging between 10 Kev to 180 Kev and dosage preferably greater than or equal to $1 \times 10^{15}$ ions/cm$^2$, sufficient damage is done to the crystalline silicon to convert it to a highly resistive state. Dosages lower than $1 \times 10^{15}$ ions/cm$^2$ were found to give erratic behavior in switching. Thereafter, antifuse can be switched to a low resistance state by the application of a suitable electrical switching voltage. Any combination of energy and dosage values falling within the above ranges will produce an antifuse that can be switched from a high resistance state to a low resistance state with 7 to 24 volts DC.

In the processing steps shown in FIGS. 8 through 10 a higher energy of 50 to 180 Kev at doses greater than or equal to $1 \times 10^{15}$ ions/cm$^2$ is used to provide a sufficiently thick amorphous layer to allow the alloying therewith of a platinel silicide layer (PtNiSi) of thickness about 500A or other silicide such as PtSi or PdSi without destroying the effectiveness of the antifuse properties of the amorphous layer or high energy implant region 60. Lower energy implants may be used in conjunction with a thinner silicide layer.

It is possible that higher energies can be used with the development of commercial implanters capable of producing energies higher than 180 Kev.

Accordingly, following the formation of the implant region 60 the photoresist layer 56 is removed, thereby exposing the semiconductor regions 48 and 54 for deposition of metallic contacts thereon. The metallic contacts applied to the semiconductor regions are ohmic and may comprise plural layers. Contacts made to the N+ contact region 54 and the high energy implant region 60 may comprise a bottom layer 62 of platinum nickel silicide, shown in FIG. 9, followed by a barrier metal layer 64 of titanium tungsten and then an aluminum layer, shown in FIG. 10 as parts 66 for the implant region 60 and a part 66a for the N+ contact region 54. The platinum nickel silicide layer 62, often referred to as platinel silicide, may be formed from a composition of 60% nickel and 40% platinum and which when alloyed with the silicon forms a ternary alloy. Reference is made to U.S. Pat. No. 3,855,612 to Rosvold for a further description of platinel silicide contacts. The platinel silicide layer 62 provides good ohmic contact.

Further fabrication processing, where dual metalization is provided, may include the deposition of a top layer of aluminum separated from the bottom layer 66 and 66a of aluminum by a glass layer of silicon dioxide, with the latter having openings to provide conductive contacts between the two levels of aluminum metalization.

Between each one of the contacts 66 and the contact 66a there exists an electrical series path that includes the implant region 60 of high resistance, the PN junction diode formed by P type region 48 and the N− type epitaxial layer 36, and the relatively low resistance path through the N+ buried layer 28, N− epitaxial layer 36 and N+ contact region 54. The implant region 60 which is of high resistance prior to programming constitutes a vertical antifuse which can be switched to a low resistance state by the application of a suitable electrical bias voltage, and the PN junction diode comprising the P type region 48 and the N− epitaxial layer 36 constitutes the vertical array diode that is not switchable.

In a programming operation the contact layer 66a is coupled to a negative or reference potential, such as ground, and the contact layer 66 is coupled to a source of positive potential, such as 7 to 24 volts. The PN junction diode comprising the P type region 48 and the epitaxial layer 36 is forward biased and current will flow through the diode in the forward direction. Substantially all of the applied potential difference will appear across the implant region 60 in its thickness direction. The amount of bias voltage is enough to switch the implant region 60 from a high resistance state to a low resistance state, thereby completing an electrical circuit path between a bit line, such as contact 66 or a line connected thereto, and a word line, such as contact 66a or a line connected thereto. Once the state of the implant region 60 is switched, it is irreversible. That is, the implant region 60 cannot be switched back to its highly resistive state by applying another bias voltage.

FIGS. 11 through 13 show a variation of the processing sequence that may be used in case a lower range of energy intensity of ions is employed to form the implant region 60, such as 30 Kev. In this event, the implant region 60 may be too thin to permit formation thereon of the platinel silicide layer 62 of FIGS. 9 and 10. In this embodiment, the same processing steps may be used as were described in connection with FIGS. 1 through 7.

After the annealing step which occurs following the stage shown in FIG. 7 and which drives the P regions 48 and the N+ contact region 54 deeper into the epitaxial layer 36, the photoresist layer 50 shown in FIG. 7 is removed and the platinel silicide layer 62 is applied. The platinel silicide layer 62 alloys only with the N+ region 54 and is prevented by the thin oxide layer 38 from alloying with the P regions 48.

The application of the platinel silicide layer 62 requires no additional masking or photoresist application, since the oxide provides this function. Whatever metal that does not alloy with the semiconductor rests on the oxide and is easily removed by chemical etching without unduly affecting the platinel silicide, since the alloy is now a part of the semiconductor. This is true also for the platinel silicide formation shown in FIG. 9, where the alloy formation occurs in all of the exposed semiconductor regions.

The next step is shown in FIG. 12 where a photoresist masking layer 68 is applied to shield the N+ region 54 and expose the P regions 48 to implantation of argon ions. In this case, however, the energy intensity is in the lower end of the range of 10 Kev so that the implant region 60 is not so deep as it was with the higher end of the range of 180 Kev.

Following the formation of the implant region 60, the additional contact metallization comprising barrier metal layer 64 and aluminum layer 66 and 66a is applied, as shown in FIG. 13. The additional upper level metallization can also be applied here in conventional manner.

Figure 14:
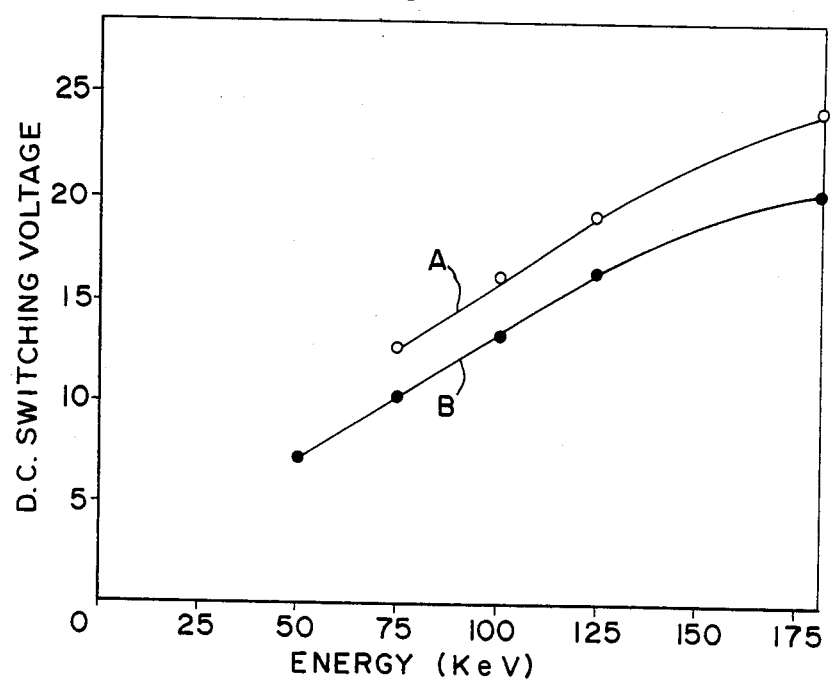
FIG. 14 is a graph showing the variation of switching voltage for an argon ion implanted antifuse with the implant energy.

FIG. 14 is a graph showing the dependence of the switching voltage of the amorphous silicon antifuse on the implant energy used to produce the antifuse. Curve A shows test results with dosage held constant at $5 \times 10^{15}$ argon ions/cm$^2$, and curve B shows test results with dosage held constant at $1 \times 10^{15}$ argon ions/cm$^2$. In both cases, the contact to the antifuse was made with platinel silicide, as shown in FIGS. 9 and 10. It is seen that the switching voltage increases with increasing implant energy. For instance curve B shows that with a low implant energy of 50 Kev the switching voltage was measured to be 7 volts DC, and with a high implant energy of 180 Kev the switching voltage was 20 volts DC. Curve A shows that with an implant energy of 75 Kev the switching voltage was 12.5 volts DC and with an implant energy of 180 Kev the switching voltage was 24 volts DC.

Figure 15:
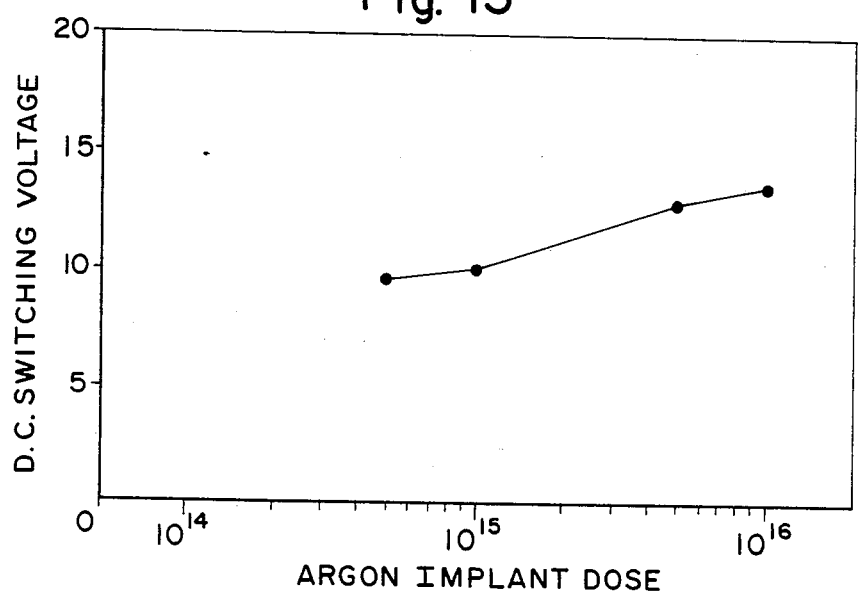
FIG. 15 is a graph showing the variation of switching voltage for an argon ion implanted antifuse with the ion implant dosage.

FIG. 15 is a graph showing the dependence of the switching voltage of the amorphous silicon antifuse on the dosage of argon ions used to produce the antifuse. In this test the implant energy was held constant at 30 Kev. The test shows that the switching voltage increases from 9.5 to 13.5 volts DC with increasing dosage of argon ions in the range of $5 \times 10^{14}$ to $1 \times 10^{16}$ ions/cm$^2$.

There are several advantages that result from the use of implantation to form a vertical antifuse. One advantage lies in the reproducibility and ease of manufacture due to the good control of dose and energy in modern commercially available ion implanters. Another advantage lies in the elimination of the photomasking and etching steps that are required for deposited films, thereby greatly simplifying the manufacturing process. Still another advantage lies in the self-alignment capability which facilitates the use of tighter tolerances and, as a consequence, smaller circuit sizes. Because the implanted antifuse is formed within a region of a semiconductor body itself rather than on or apart from the body, it is protected from the corrosive effects and other sources of deterioration that an exposed fuse or antifuse would otherwise be subject to.

What we claim is:

1. A method of fabricating a semiconductive programmable read only memory cell, comprising:
    (a) locally oxidizing selected surface regions of a body of monocrystalline semiconductor of first type conductivity to produce a plurality of isolated semiconductor regions in said body;
    (b) introducing dopant impurities of opposite second type conductivity in a first one of said isolated semiconductor regions to produce a first region of second type conductivity forming a semiconductive junction with said body at a location beneath the surface of said body;
    (c) implanting ions of sufficiently high energy and density within a surface layer of said first region to convert said surface layer to amorphous form that is electrically and irreversibly switchable from high resistance state to low resistance state; and
    (d) introducing dopant impurities of first type conductivity in a second one of said isolated semiconductor regions lying adjacent to said first isolated region to form a low resistance contact region at the surface of said body.

2. A method according to claim 1 and further including forming a low resistance semiconductor region of first type conductivity within said body spaced from and lying beneath said semiconductive junction and said low resistance contact region.

3. A method according to claim 1 wherein said impurity ions in step (c) are ions of neutral conductivity in the semiconductor.

4. A method according to claim 1 wherein said impurity ions in step (c) are of second type conductivity.

5. A method according to claim 1 wherein said semiconductor body is lightly doped N type silicon.

6. A method according to claim 1 wherein the impurity ions in step (c) are implanted with an energy substantially in the range of 10 Kev to 180 Kev.

7. A method according to claim 1 wherein the impurity ions in step (c) have a dose of $1 \times 10^{15}$ ions per square centimeter or greater.

8. A method according to claim 7 wherein the impurity ions in step (c) are argon.

9. A method of fabricating a programmable read-only memory cell according to the steps of:
    creating means to laterally electrically isolate islands of an upper zone of first type conductivity in a monocrystalline semiconductor body;
    introducing an impurity of opposite second type conductivity into a first of the islands to produce therein a region of second type conductivity extending along the upper surface of the island and forming a PN junction with semiconductive material of the island outside the region;
    implanting ions of sufficiently high energy and dosage into a layer of the region along its upper surface to convert this surface layer into a highly resistive amorphous form that is electrically and irreversably switchable to a low resistance state; and
    creating a path of first type conductivity in the body extending from the PN junction through a second of the islands to its upper surface.

10. A method according to claim 9 wherein the ions implanted into the surface layer are neutral with respect to the first and second type conductivities.

11. A method according to claim 10 wherein the implanted ions are from Group O (inert gas group).

12. A method according to claim 9 wherein the ions implanted into the surface layer are of second type conductivity.

13. A method according to claim 9 wherein the dosage of the ions implanted into the surface layer is at least $10^{15}$ ions/cm$^2$.

14. A method according to claim 9 wherein the ions implanted into the surface layer comprise argon at a dosage of at least $10^{15}$ ions/cm$^2$.

15. A method according to claim 9 wherein the side boundaries of the first island laterally bound the PN junction.

16. A method according to claim 15 further including the step of forming first and second electrically conductive layers in ohmic contact with the surface layer and the second island, respectively, at their upper surfaces, the surface layer being switched to its low resistance state upon application of a voltage of sufficient magnitude between the conductive layers in the forward conductive direction of the PN junction.

17. A method according to claim 16 wherein the body comprises silicon.

18. A method according to claim 17 wherein the conductive layers comprise metal silicide at least where they contact the surface layer and the second island.

19. A method according to claim 17 wherein: the first conductive layer comprises a non-silicide barrier metal at least along the surface layer; and the second conductive layer comprises a metal silicide at least along the second island.

* * * * *